(12) United States Patent
Zhao

(10) Patent No.: US 12,431,402 B2
(45) Date of Patent: Sep. 30, 2025

(54) STRESS AND WARPAGE IMPROVEMENTS FOR STIFFENER RING PACKAGE WITH EXPOSED DIE(S)

(71) Applicant: Avago Technologies International Sales Pte. Limited, Singapore (SG)

(72) Inventor: Sam Ziqun Zhao, Irvine, CA (US)

(73) Assignee: Avago Technologies International Sales Pte. Limited, Singapore (SG)

(*) Notice: Subject to any disclaimer, the term of this patent is extended or adjusted under 35 U.S.C. 154(b) by 572 days.

(21) Appl. No.: 17/873,583

(22) Filed: Jul. 26, 2022

(65) Prior Publication Data

US 2024/0038615 A1 Feb. 1, 2024

(51) Int. Cl.
*H01L 23/00* (2006.01)
*H01L 21/56* (2006.01)
(Continued)

(52) U.S. Cl.
CPC ........ *H01L 23/3185* (2013.01); *H01L 21/563* (2013.01); *H01L 21/565* (2013.01); *H01L 23/3192* (2013.01); *H01L 23/3675* (2013.01); *H01L 25/0655* (2013.01); *H01L 23/13* (2013.01); *H01L 24/16* (2013.01); *H01L 24/32* (2013.01); *H01L 24/73* (2013.01); *H01L 25/0652* (2013.01); *H01L 2224/16225* (2013.01); *H01L 2224/32225* (2013.01); *H01L 2224/73204* (2013.01);
(Continued)

(58) Field of Classification Search
CPC ............... H01L 23/3185; H01L 21/563; H01L 21/565; H01L 23/3192; H01L 23/3675; H01L 25/0655; H01L 23/13; H01L 24/16; H01L 24/32; H01L 24/73; H01L 25/0652; H01L 2224/16225; H01L 2224/32225; H01L 2224/73204; H01L 2924/182; H01L 2924/186; H01L 2924/3511; H01L 2924/3512; H01L 25/18; H01L 23/3128; H01L 23/49816; H01L 2225/06589; H01L 23/367; H01L 23/16; H01L 23/4334; H01L 23/562; H01L 23/3121; H01L 21/56; H01L 23/3672
See application file for complete search history.

(56) References Cited

U.S. PATENT DOCUMENTS 5,838,545 A * 11/1998 Clocher .............. H01L 25/0655
257/668
7,315,080 B1 1/2008 Fan et al.
(Continued)

*Primary Examiner* — Elias Ullah
(74) *Attorney, Agent, or Firm* — Quarles & Brady LLP

(57) ABSTRACT

A package, and method for building the package is disclosed. The package includes a substrate having a first surface. The package further includes a die having opposing first and second surfaces, and a lateral surface, with the second surface of the die coupled to the first surface of the substrate. The package further includes a stiffener element having a first surface and a lateral surface, with the first surface of the stiffener element coupled to the first surface of the substrate. The package further includes molding material disposed on the first surface of the substrate and the lateral surface of the die. The coefficient of thermal expansion (CTE) value of the molding material is greater than a CTE value of the die. The first molding surface of the molding material is coplanar with the first surface of the die.

20 Claims, 19 Drawing Sheets

(51) Int. Cl.
  *H01L 23/31*    (2006.01)
  *H01L 23/367*   (2006.01)
  *H01L 25/065*   (2023.01)
  *H01L 23/13*    (2006.01)

(52) U.S. Cl.
  CPC ............... *H01L 2924/182* (2013.01); *H01L 2924/186* (2013.01); *H01L 2924/3511* (2013.01); *H01L 2924/3512* (2013.01)

(56) References Cited

U.S. PATENT DOCUMENTS

| | | |
|---|---|---|
| 7,791,195 B2 | 9/2010 | Kim |
| 8,941,208 B2 | 1/2015 | Chauhan et al. |
| 2002/0019080 A1 | 2/2002 | Wensel et al. |
| 2002/0185720 A1 | 12/2002 | Khan et al. |
| 2003/0025215 A1 | 2/2003 | Lee et al. |
| 2005/0140005 A1 | 6/2005 | Huang et al. |
| 2005/0258552 A1 | 11/2005 | Kim |
| 2006/0103021 A1 | 5/2006 | Liu et al. |
| 2009/0302435 A1 | 12/2009 | Pagaila et al. |
| 2019/0035720 A1 | 1/2019 | Lai et al. |

\* cited by examiner

STRESS AND WARPAGE IMPROVEMENTS FOR STIFFENER RING PACKAGE WITH EXPOSED DIE(S)

BACKGROUND

Semiconductor packages with exposed dies are prone to damage when bonded to heat sinks and other componentry, causing device failures in the form of die cracks and chip-offs, especially on corners and edges of the die. To reduce the warpage of large packages (e.g., greater than 45 mm×45 mm) with exposed dies, a stiffener ring is often attached to the periphery of package substrate. However, stiffener ring packages are often susceptible to high tensile stresses at the contact interface between stiffener ring and the package substrate due to thermal expansion coefficient (CTE) mismatch between the die, substrate, and the stiffener ring. During package production and usage, the thermal stress interaction can cause initiation and growth of cracks in the substrate at or near the contact interface with the stiffener ring. Furthermore, stiffener rings become less effective for package warpage reduction as packages continue to increase in size (e.g., greater than 65 mm×65 mm). Accordingly, it is desirable to provide a solution that reduces warpage and prevents package failures for these larger packages upon temperature changes during manufacturing processes and field applications.

SUMMARY

A system is disclosed. In embodiments, the system includes a package, which further includes a substrate having a first surface, and a die having opposing first and second surfaces. In embodiments, the second surface of the die is coupled to the first surface of the substrate. In embodiments, the system includes a stiffener element having a first surface and a lateral surface, with the first surface of the stiffener element coupled to the first surface of the substrate at a first interface. In embodiments, the system includes molding material disposed on the first surface of the substrate and the lateral surface of the die. In embodiments, a coefficient of thermal expansion (CTE) value of the molding material is greater than a CTE value of the die.

A method is disclosed. In embodiments, the system includes providing a die having a first surface, and a second surface opposed to the first surface. In embodiments, the method includes coupling a die to a first surface of a substrate. In embodiments, the method includes coupling a first stiffener element to the first surface of the substrate. In embodiments, the method further includes disposing molding material on the first surface of the substrate, at least one lateral side of the stiffener element, and at least one lateral surface of the die. In embodiments, a first molding surface of the molding material is substantially flush with the first surface of the die.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1A:
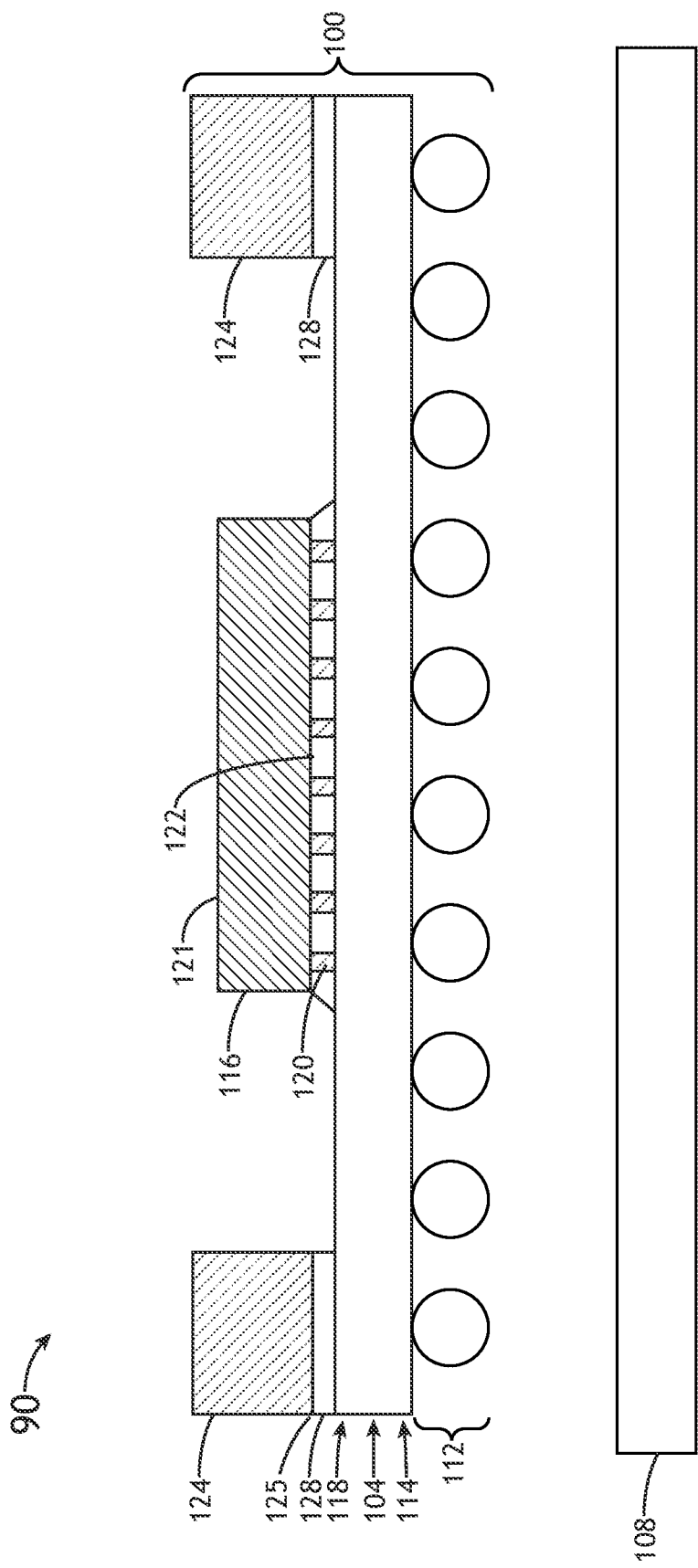
FIG. 1A is a drawing illustrating a cut-away side view of a system that includes electronic componentry, in accordance with one or more embodiments of the disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

As used herein, directional terms such as "top," "bottom," "over," "under," "upper," "upward," "lower," "down," and "downward" are intended to provide relative positions for purposes of description and are not intended to designate an absolute frame of reference. Various modifications to the described embodiments will be apparent to those with skill in the art, and the general principles defined herein may be applied to other embodiments.

It is to be understood that, in a conceptual sense, any arrangement of components to achieve the same functionality, common goal, objective, result, or structure is effectively "associated" or "coupled" such that the desired functionality, common goal, objective, result, or structure is achieved. Hence, any two components herein combined to achieve a particular structure can be seen as "coupled to" each other such that the desired structure and/or functionality is achieved, irrespective of architectures or intermedial components. Likewise, any two components so associated can also be viewed as being "connected," or "disposed," to each other to achieve the desired functionality, and any two components capable of being so associated can also be viewed as being "couplable," to each other to achieve the desired structure or functionality (e.g., "operably coupled"). Additionally, unless otherwise indicated, a description indicating that one component is "connected to" another component or "between" two components indicates that such components are functionally connected and does not necessarily indicate that such components are physically in contact. Rather, such components may be in physical contact or may alternatively include intervening elements. Similarly, descriptions that a particular component is "fabricated over" another component (alternatively "located on," "disposed on," or the like) indicates a relative position of such components but does not necessarily indicate that such components are physically in contact. Such components may be in physical contact or may alternatively include intervening elements.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

An electronic package containing a substrate, a die, a stiffener element, and molding material is disclosed. The molding material is deposited on the package so that top of the die is substantially flush, or coplanar to the molding material. The molding material protects the die from cracking when coupling the die to other package components, such as a heat sink. The molding material also reduces substrate stresses and warpage at the interface between the substrate and the stiffener element. The molding material is formulated to exhibit coefficient of thermal expansion (CTE) values that minimize package warpage and substrate stresses.

FIG. 1A is a drawing illustrating a cut-away side-view of a system 90 that includes an integrated circuit (IC) semiconductor chip and other electronic componentry, in accordance with one or more embodiments of the disclosure. The system 90 includes a package 100, also referred to as a semiconductor package, an IC package, a chip package, or an electronic package. The package 100 organizes and provides connectivity for the semiconductor chip (e.g., integrated circuits) within the system 90. In some embodiments, the system 90 includes only the package 100, and the semiconductor chip or chips within the package 100.

In embodiments, the package includes a substrate 104 configured to provide electrical connectivity and structural protection to package elements. The substrate 104 may be of any type including but not limited to Ajinomoto build-up film (ABF) substrate, BT (Bismaleimide Triazine) laminate substrate, ceramic substrate, and the like. In embodiments, the system 90 further includes, or is connected to, a circuit board 108 (e.g., printed circuit board (PCB)). The printed circuit board 108 may itself be a component of a larger system that includes a user device, such as a cell phone, smart watch, gaming system, tablet, or computer. The substrate 104 may be coupled to the printed circuit board 108 via solder balls 112 (e.g., BGA balls), or other connective technology that is attached to a bottom side (e.g., a second surface 114) of the substrate 104. The substrate 104 may be configured for large package sizes. For example, the substrate 104 may have a dimension (e.g., a length or a width) approximately equal to, or greater than, 45 mm. For instance, the substrate may have the approximate dimensions of a 45 mm×45 mm square. In another example, the substrate may have a dimension approximately equal to, or larger than, 65 mm. For instance, the substrate may have the approximate dimensions of a 65 mm×65 mm square.

In embodiments, the package 100 includes at least one die 116 (e.g., an integrated circuit-containing semiconductor chip) coupled to a top side (e.g., a first surface 118) of the substrate 104. The die 116 includes a first die surface 121 (e.g., a first surface) and a second die surface 122 (e.g., a second surface). The first die surface 121 and the second die surface 122 are opposed to each other (e.g., located opposite to each other), with the second die surface 122 coupling to the first surface of the substrate 104. The die 116 may be configured as any type of semiconductor device or devices, including but not limited to, an IC chip, multiple semiconductor chips, chip system in a packaged module, integrated passive devices, or microelectromechanical system (MEMS) devices. For example, the die 116 may be configured as a chip on a through-silicon-via (TSV) interposer as in the CoWoS (Chip-on-Wafer-on-Substrate package, or a 2.5D integrated circuit package) manufactured by Taiwan Semiconductor Manufacturing Company (TSMC).

The die 116 may be configured to bind to the substrate 104 via any type of connective elements 120 including but not limited to flip chip, surface-mount, or wire-mount packaging elements. For example, the die 116 may be configured to couple to the substrate 104 via a flip chip die attachment method. The die 116 may be bound to the substrate 104 in any orientation or type of configuration. For example, the die 116 may be configured as a flip chip, having flip chip connections, also known as controlled collapse chip connections, or C4. The flip chip connectors allow the die 116 to couple to the substrate 104 via solder bumps, copper pillars with solder caps, or other connective elements that have been deposited onto connective pads on the die. During the flip chip mounting process, the die 116 is flipped, and the connective elements 120 are matched with corresponding pads on the substrate 104. In this manner, a face of the die 116 containing the integrated circuitry is directed downward as the second die surface 122, while the backside of the die 116 faces upward as the first die surface 121.

In some embodiments, the package further includes a stiffener element 124. The stiffener element 124 has a first surface 125 that is bound to the first surface 118 of the substrate 104 via a stiffener attachment adhesive 128 (e.g., a first interface). The stiffener attachment adhesive 128 may comprise a thermoset resin/epoxy, or other type of adhesive materials. The stiffener element 124 limits warpage of the substrate 104 when the substrate 104 is heated (e.g., heat produced during production of the package 100 or by the generation of heat in the die 116 during use). Without the stiffener element 124, the substrate 104 may expand to a greater extent than the die with temperature increase, due to a difference in the coefficient of thermal expansion (CTE) between the two materials. This difference in CTE values results in a differential expansion of materials within the package resulting in a bowed appearance that places stress on the die 116 and substrate 104, potentially leading to cracking and failure of the die 116 or the substrate 104. Warpage of the substrate 104 may also lead to improper bonding of the package 100 to the printed circuit board 108, leading to shorting or open contacts. The binding of the stiffener element 124 to the substrate 104 partially reduces the warpage of the substrate 104 and also conducts heat away from the substrate 104. The stiffener element 124 may be constructed of any type of material including but not limited to metal, such as copper, and may be of any size or shape. For example, the stiffener element 124 may be configured, or shaped, as a ring, The shape of the stiffener element 124 may also be configured as, but not be limited to, a cross, a square, or a bar. Additionally, the stiffener element 124 may contain cavities and/or slots within to provide rooms for other surface mount components such as capacitors on substrate surface 118 under the shadow of the stiffener first surface 125.

CTE is used to predict the linear expansion of a material when heated, and can be determined according to the equation:

$$CTE_i = \frac{1}{x_i}\frac{dx_i}{dT}, \quad \text{(equation 1)}$$

Where $X_i$ is the linear dimension (e.g., a length or a width) of the $i^{th}$ material component, and T is the temperature. CTE values are typically reported as ppm/° C. For example, for a length of copper one centimeter in length, the copper having a CTE value of approximately 16.6 ppm/° C., an increase in the temperature of the copper from 0° C. to 100° C. would result in a predicted expansion of a 1 mm length of the copper by 1.67 µm. The CTE value of the substrate 104, $CTE_{substrate}$, may range from 10-17 ppm/° C. The CTE value of the die 116, $CTE_{die}$, can range from 2-4 ppm/° C.

In embodiments, the stiffener element 124 has a CTE value, $CTE_{stiffener}$, similar to the $CTE_{substrate}$. For example, the stiffener element 124 may have a $CTE_{stiffener}$ value of approximately 16 ppm/° C., and the substrate 104 may have a $CTE_{substrate}$ value in a range of approximately 16 ppm/° C. (e.g., within the 10-17 ppm/° C. range). In another example, the ratio of the $CTE_{stiffener}$ value to the $CTE_{substrate}$ value is equal to or less than 1.6. For instance, the $CTE_{stiffener}$ value may have a value of approximately 16 ppm/° C. and the $CTE_{substrate}$ value may have a value of approximately 10 ppm/° C. (e.g., $CTE_{stiffener}$:$CTE_{substrate}$ is approximately 1.6). In another instance, the $CTE_{stiffener}$:$CTE_{substrate}$ ratio is equal, or less than, 1.4. In another instance, the $CTE_{stiffener}$:CTEsubstrate ratio is equal to, or less than, 1.2. In another instance, the $CTE_{stiffener}$:CTEsubstrate ratio is equal to, or less than, 1.0.

It should be understood that the CTE values described herein represent CTE values at temperatures less than the glass transition temperature ($T_g$) for package components. For example, for a substrate 104 having a $T_g$ of 130° C., the $CTE_{substrate}$ value used herein may include a $CTE_{substrate}$ value for a temperature less than 130° C. For instance, the $CTE_{substrate}$ value for the substrate 104 used herein may include a $CTE_{substrate}$ value for a temperature within the range of 0° C. to 120° C., of 0° C. to 100° C., of 10° C. to 100° C., of 20° C. to 100° C., of 22° C. (e.g., room temperature) to 100° C., of 30° C. to 80° C., or of 50° C. to 70° C. In particular, the $CTE_{substrate}$ value for the substrate 104 used herein may include a $CTE_{substrate}$ value for a temperature of approximately 0° C., approximately 20° C., approximately 22° C., approximately 25° C. (e.g., room temperature), or approximately 100° C.

Figure 1B:
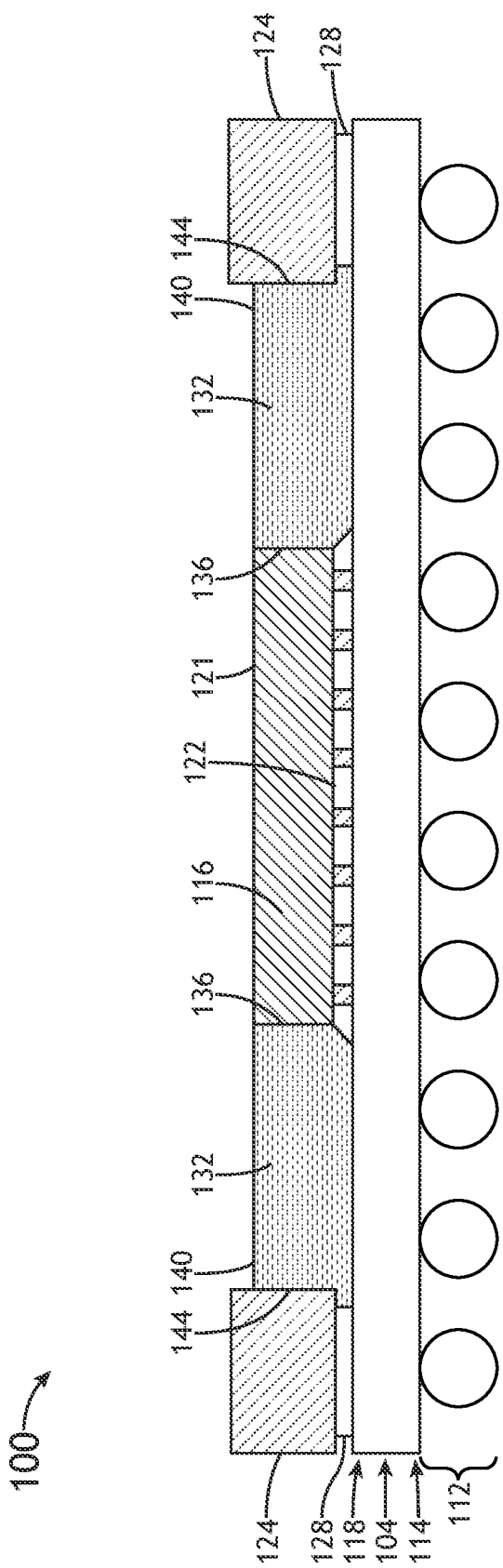
FIG. 1B is a drawing illustrating a cut-away side view of the package, in accordance with one or more embodiments of the disclosure.

FIG. 1B is a drawing illustrating a cut-away side view of the package 100, in accordance with one or more embodiments of the disclosure. In embodiments, the package 100 further includes molding material 132 that is applied, or disposed on, both the first surface 118 of the substrate 104 and at least one lateral die surface 136 (e.g., a lateral surface of the die 116). The molding material 132 may be disposed in a continuous form, as single body, onto the first surface 118 of the substrate 104 and at least one lateral die surface 136 of the die 116. For example, a continuous line of molding material 132 may be applied to the package 100 that contacts both the first surface 118 of the substrate 104 and one lateral die surface 136 of the die 116. In another example, a block of molding material 132 may be applied to the package 100 that contacts both the first surface 118 of the substrate 104 and one lateral die surface 136 of the die 116. For instance, the block of molding material 132 may have several openings or holes (e.g., where dies 116 or other package componentry pass through the molding material 132, or spaces where the first surface 118 of the substrate 104 are not covered), with a continuous portion of molding material 132 connecting the first surface 118 of the substrate 104 to at least one lateral die surface 136 of the die 116. Along with the continuous form, or single body, of the molding material 132 disposed on the first surface 118 of the substrate 104 and the at least one lateral surface 136 of the die 116, molding material 132 may also be disposed onto other portions of the package 104 in a continuous or discontinuous manner.

In embodiments, the molding material 132 covers substantially the entirety of the lateral die surfaces 136 of the die 116, and a first molding surface 140 of the molding material 132 (e.g., a top surface of the molding material) is substantially flush, or coplanar, with first die surface 121 of the die. For example, the first molding surface 140 and the first die surface 121 may be within 1 mm of each other. In another example, the first molding surface 140 and the first die surface 121 may be within 1.0 mm of each other. In another example, the first molding surface 140 and the first die surface 121 may be within 0.1 mm of each other. In another example, the first molding surface 140 and the first die surface 121 may be within 0.01 mm of each other. In another example, the first molding surface 140 and the first die surface 121 may be within 0.001 mm of each other. The molding material may include any type of molding material including but not limited to a molding compound, a thermoset resin, an epoxy, or a glue, and may be formulated to have a specific CTE values, or a set of CTE values.

Figure 1C:
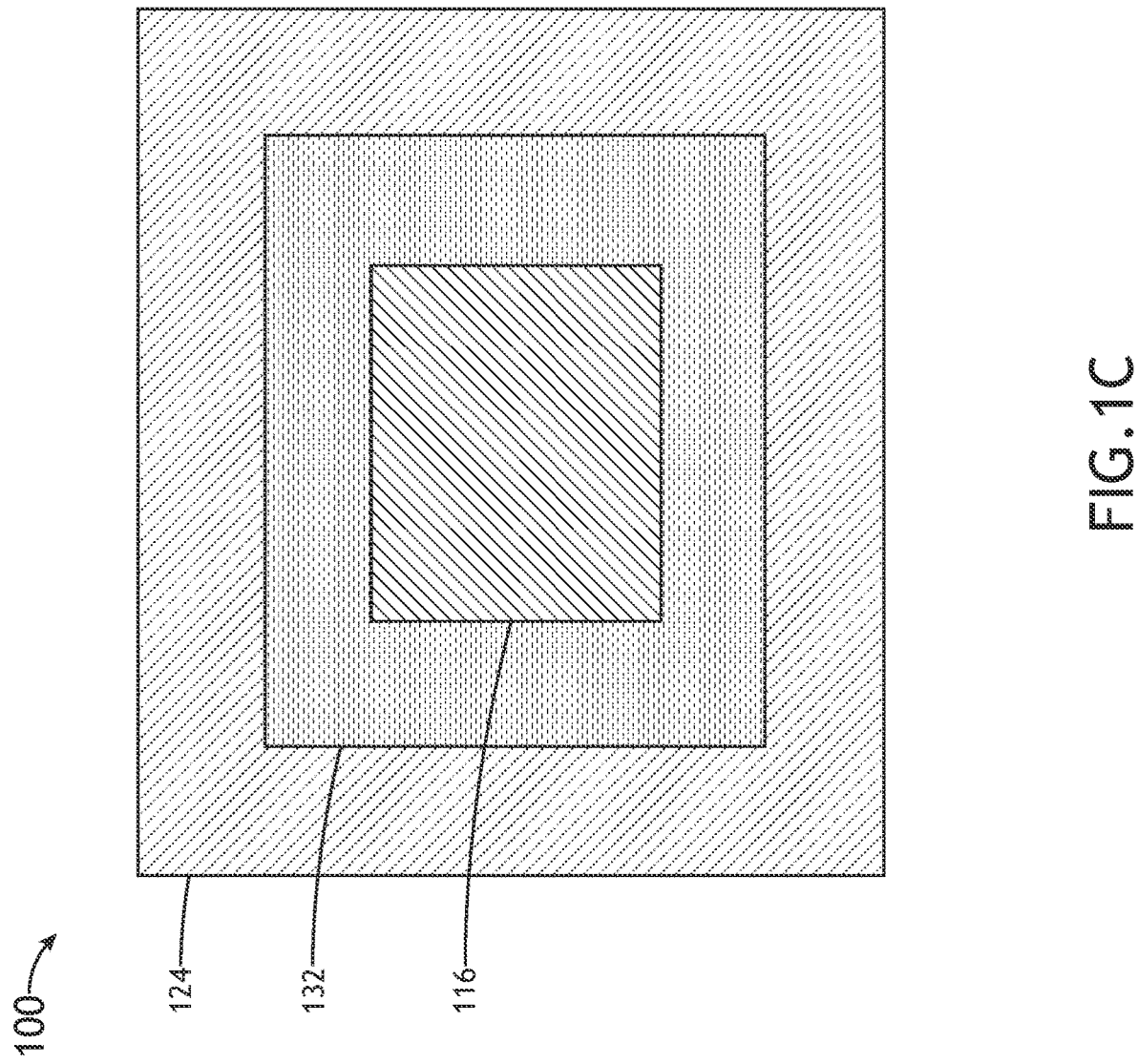
FIG. 1C is a drawing illustrating a plan view of the package; in accordance with one or more embodiments of the disclosure.

In embodiments, the molding material 132 contacts, or couples to, a lateral surface 144 of the stiffener element 124 (e.g., the body of the molding material 132 contacting the stiffener element 124, the die 116, and the substrate 104 in a continuous manner). For example, for a stiffener element 124 configured, or shaped, as a ring that surrounds the die, the molding material 132 may be deposited so as to cover a portion of the substrate 104, have a first molding surface 140 substantially flushed with the first die surface 121, and/or contact the inner lateral surface 144 of the stiffener element, as shown in FIG. 1B. A plan view of the package 100 showing the die 116, the stiffener element 124 (e.g., configured as a ring), and the molding substrate is demonstrated in FIG. 1C. The molding material 132 relieves stresses along the substrate 104. For example, the molding material 132 reduces tensile stress on the substrate 104 at or near the stiffener element 124 by distributing a tensile stress that exists along the interface of the inner lateral surface 144 of the stiffener element 124 with the interface between the molding material 132 and along the first surface 118 of the substrate 104, preventing cracking in the substrate 104 that may develop near the stiffener attachment adhesive 128. It should be noted that in some instances, the molding material 132 does not contact the stiffener element 124. Therefore, the above description should be regarded not as a limitation of the present disclosure, but as an illustration.

Figure 1D:
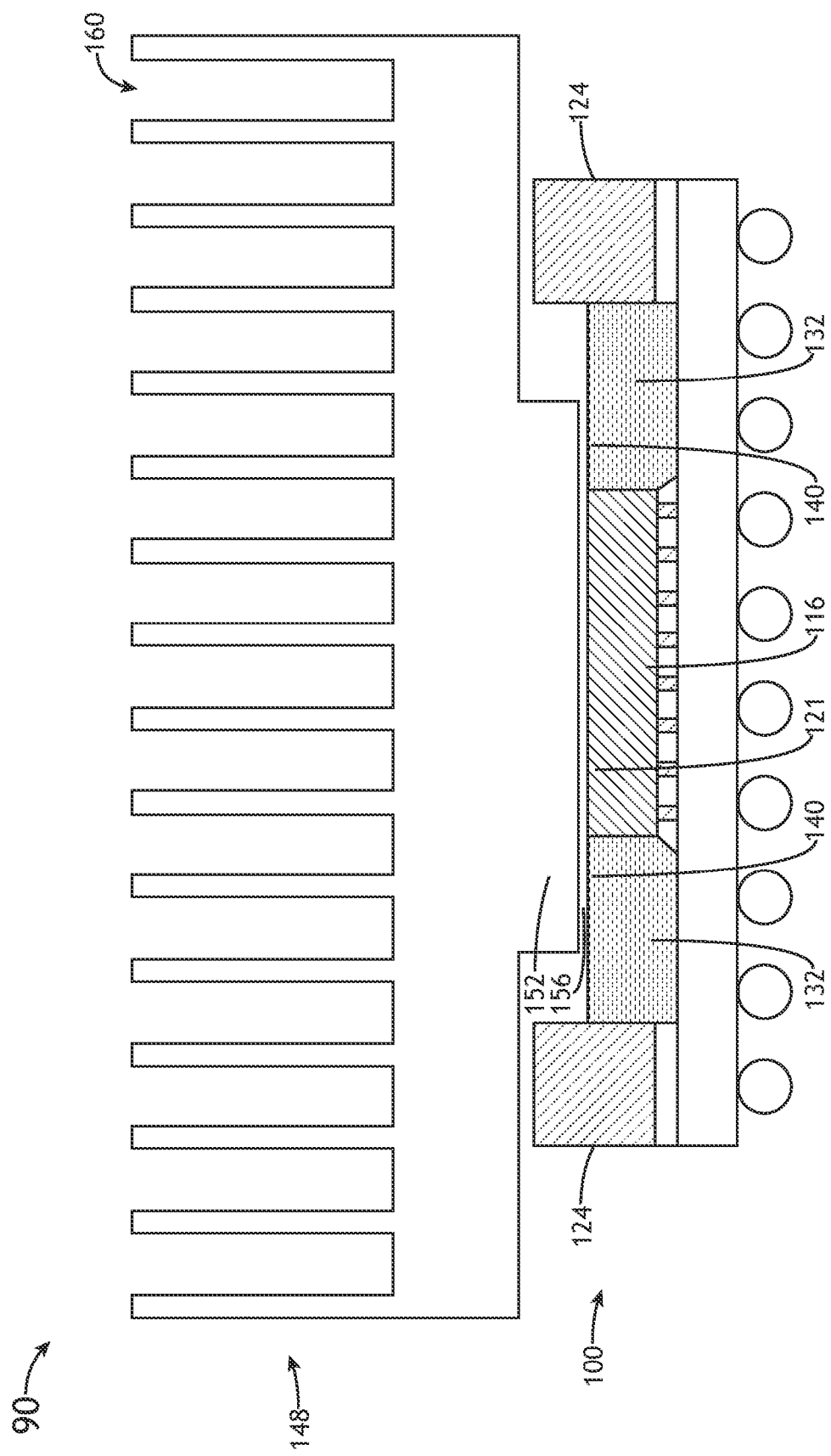
FIG. 1D is a drawing illustrating a cut-away side view of the package that includes a heat sink, in one or more embodiments of the disclosure.

In some embodiments, the system 90 includes a heat sink 148 configured to couple to the first die surface 121 and the first molding surface 140, as shown in FIG. 1D. The heat sink 148 also transfers heat away from the die 116 and substrate 104, as shown in FIG. 1D. The heat sink 148 may be configured as any type of heat-dissipating element including but not limited to active-cooling heat sinks, passive cooling heat sinks, vapor chamber and heat pipe heat sinks, fan-cooled heat sinks, thermoelectric cooling heat sinks, and the like. For example, the heat sink 148 may be configured as a passive heat sink 148 having a heat sink base 152 that couples to the first die surface 121 and the first molding surface 140 at a heat sink coupling surface 156 (e.g., a first surface of the heat sink 148). The heat sink may also include one or more heat transfer elements 160. The heat transfer elements 160 may be of any type, size, shape, or number.

In embodiments, at least one dimension (e.g., X or Y) of the heat sink coupling surface 156 is longer than at least one dimension of the first die surface 121, with the heat sink coupling surface overlapping onto the first molding surface 140. The overlapping of the heat sink coupling surface 156 over the first die surface 121 maximizes heat dissipation from the die 116 through the heat sink 148. Having the first molding surface 140 flush with, or coplanar to, the first die surface 121 prevents the corners and edges of the die 116 from contacting the heat sink surface 156 at an angle that can cause the corners and edges of the die to chip and crack.

Figure 2A:
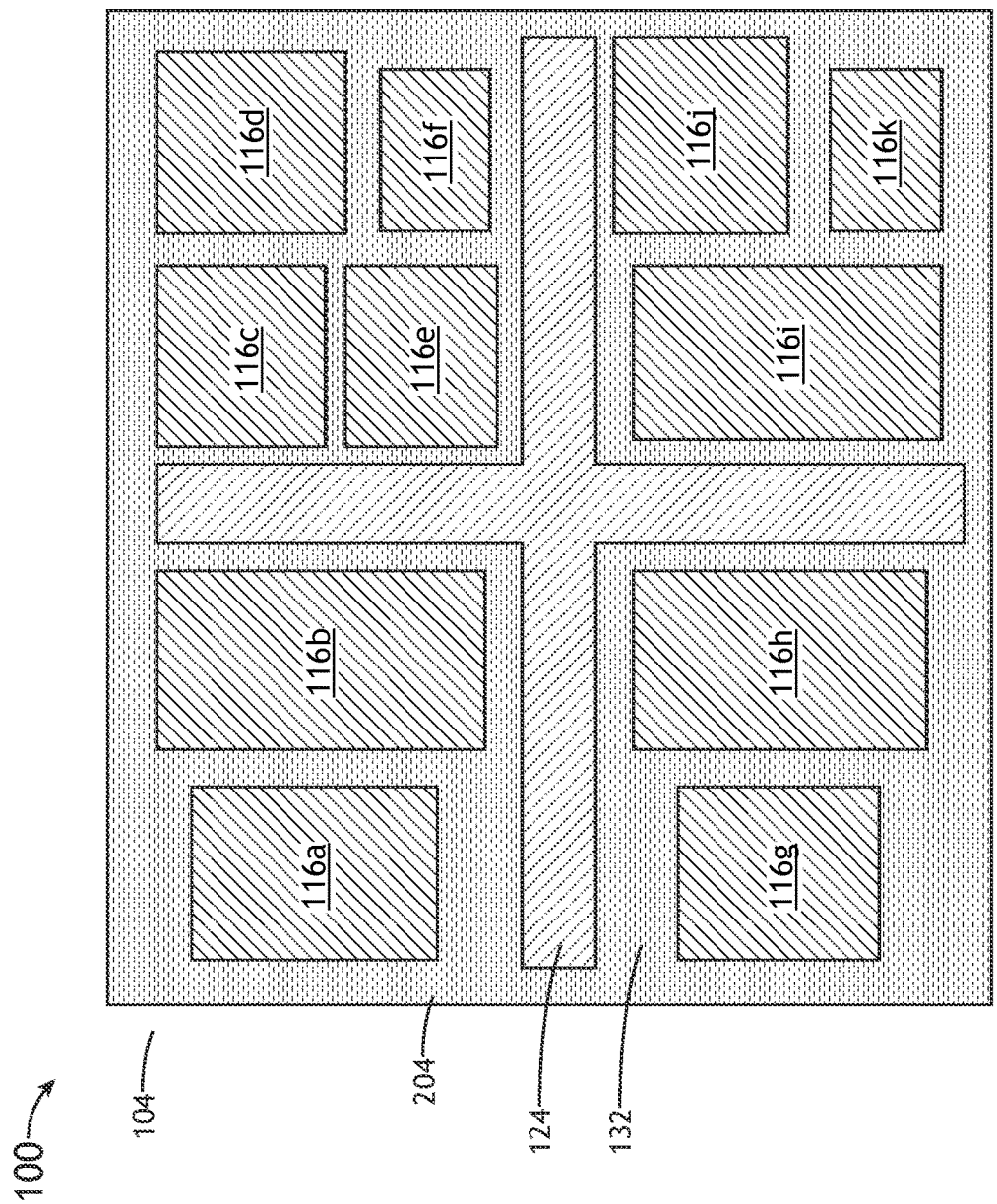
FIG. 2A is a drawing illustrating a plan view of the package; in accordance with one or more embodiments of the disclosure.
Figure 2B:
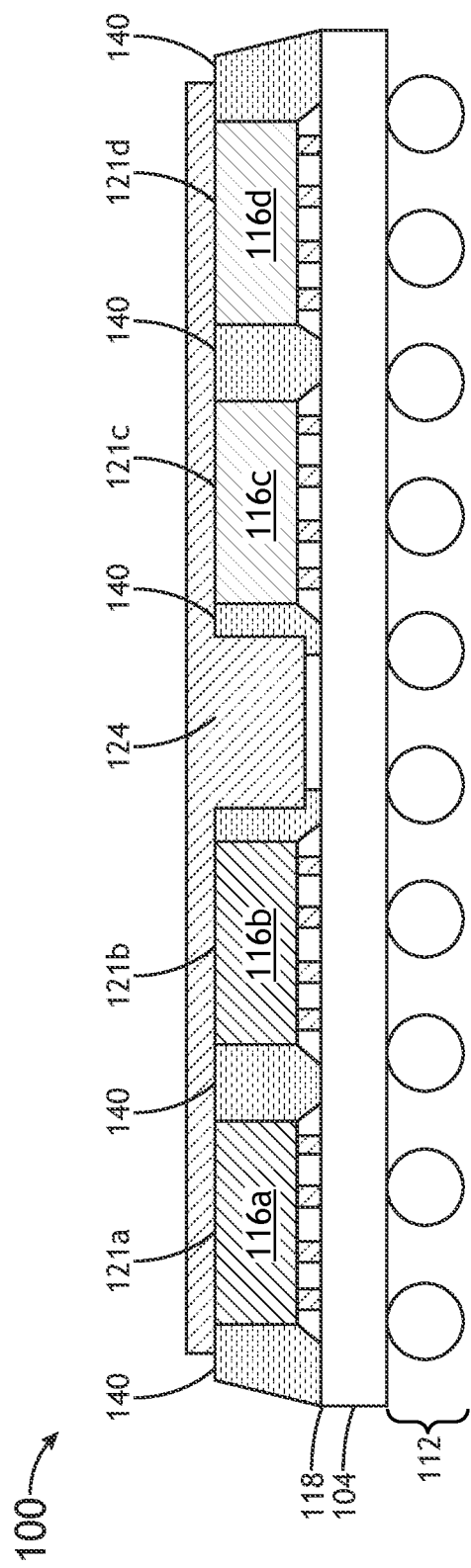
FIG. 2B is a drawing illustrating a cut-away side view of the package, in accordance with one or more embodiments of the disclosure.

FIG. 2A illustrates a plan view of the package 100 configured with a cross-shaped stiffener element 124, in accordance with one or more embodiments of the disclosure. In embodiments, the package 100 may include a plurality of dies 116a-j, with molding material 132 covering the entire area, or substantially the entire area (e.g., greater than 90%) of the first surface 118 of the substrate 104 that are not coupled to package components (e.g., all exposed areas of the substrate 104 that are not coupled to package components such as the stiffener element 124 and the plurality of dies 116a-j). In other words, the molding material, the stiffener element, and the plurality of dies cover all, or substantially all (e.g., greater than 90%) of the first surface 118 of the substrate 104. The lateral sides of each die 116 of the plurality of dies 116al-j may be bound by the molding material 132. FIG. 2B illustrates a cut-away side view of the package of FIG. 2A. As shown, the first molding surface 140 is substantially flush with the first die surfaces 121a-d.

Figure 2C:
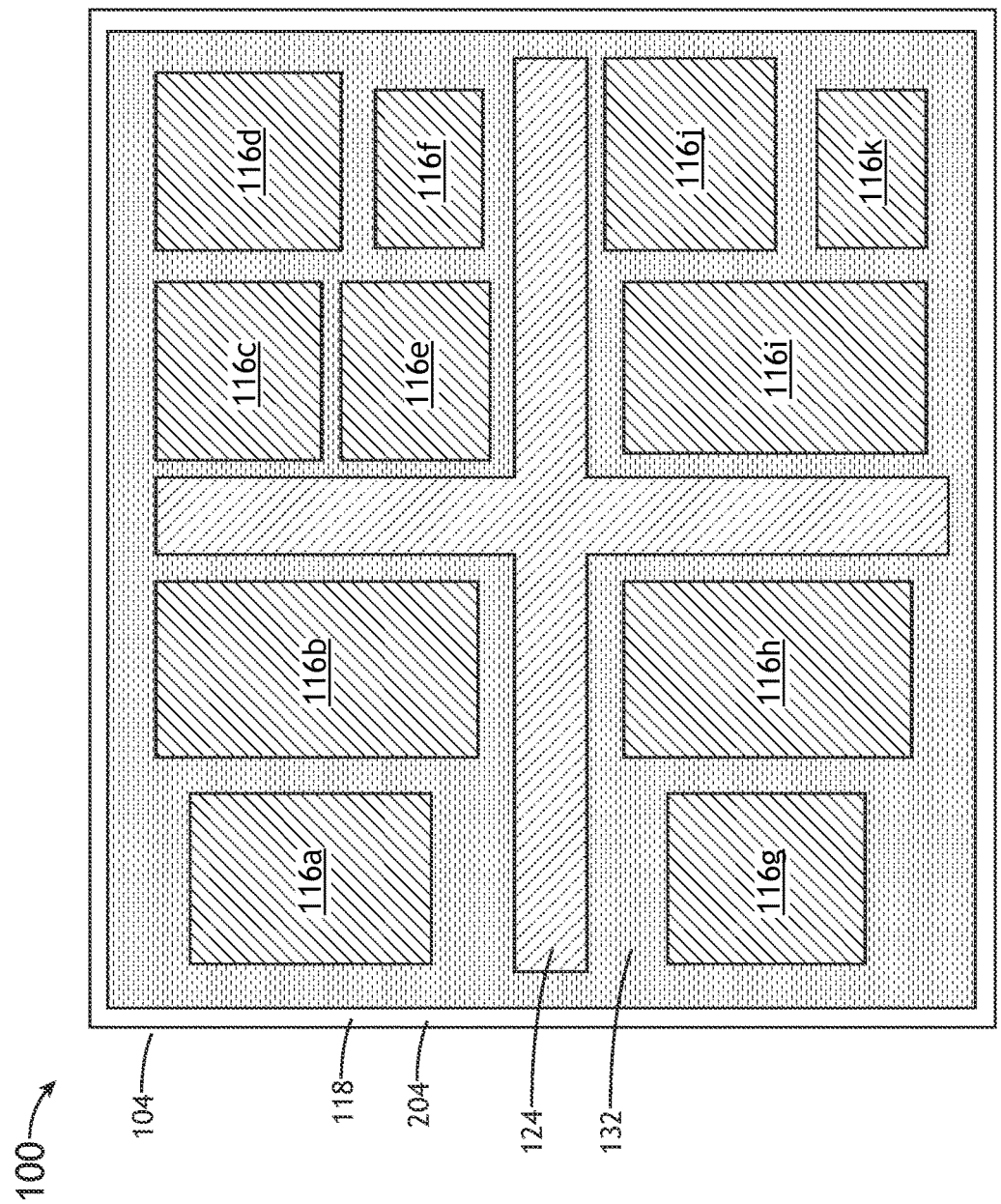
FIG. 2C is a drawing illustrating a plan view of the package; in accordance with one or more embodiments of the disclosure.

The molding material 132 may cover the entirety of the first surface 118 of the substrate 104, as shown in FIG. 2A (first surface 118 not shown). The molding material 132 may also partially cover the first surface 118 of the first substrate 104, leaving a portion of the first surface 118, such as on a perimeter 204 of the first surface 118, uncovered, or exposed, as shown in FIG. 2C. For example, the package 100 may not need the molding material 132 in portions of the package, such as the periphery, where there is little stress placed on the substrate. The perimeter 204 may include an area of less than 10 percent, less than five percent, or less than one percent of the total area of the first surface 118 of the substrate 104.

Figure 3A:
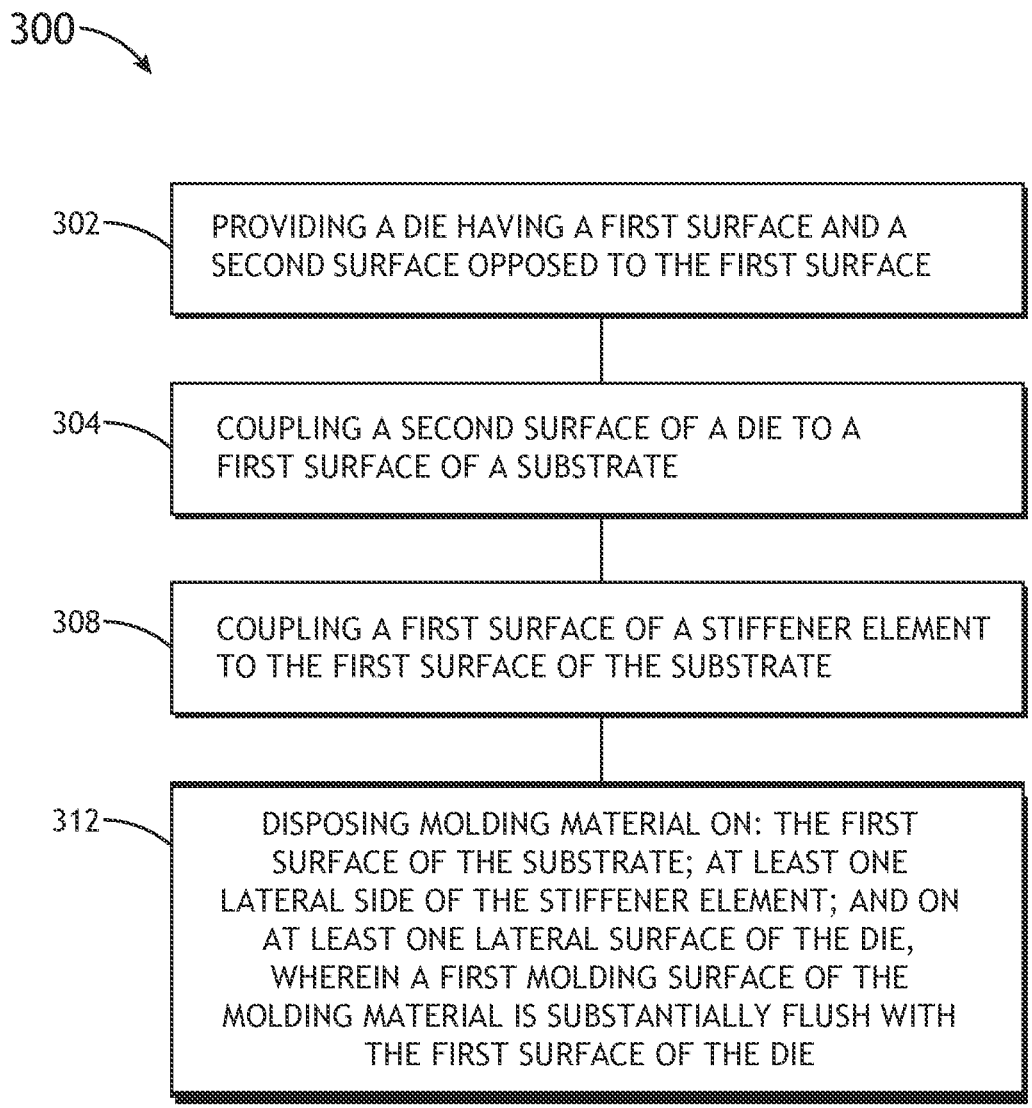
FIGS. 3A-B are flowcharts illustrating a method for building the package, in accordance with one or more embodiments of the disclosure.

FIG. 3A is a flowchart illustrating a method 300 for building the package 100, in accordance with one or more embodiments of the disclosure. The package 100 may include any type or size as described herein, and may include any, shape, size, or number of dies 116 and stiffener elements 124.

In embodiments, the method 300 includes a step 302 of providing a die having a first die surface 121 (e.g., a top surface or first surface) and a second die surface 122 (e.g., the bottom surface or second surface). For example, the die 116 may be configured as a flip chip die couplable to the substrate 104 via controlled collapse chip connections (e.g., micro solder bumps) arranged on the second die surface 122

In embodiments, the method 300 includes a step 304 of coupling a second die surface 122 (e.g., the bottom side) of the die 116 to the first surface 118 of the substrate 104. The die 116 may be any type of integrated circuit-containing semiconductor chip and have any type of physical connector. For example, the die 116 may be configured as a flip chip die with microbump connectors that couple to a corresponding array of pads located on the substrate 104.

In embodiments, the method 300 further includes a step 308 of coupling the first surface 125 of a stiffener element 124 to the first surface 118 of the substrate 104. For example, the stiffener element 124 may be coupled to the substrate 104 via the stiffener attachment adhesive 128 that includes an adhesive material.

In embodiments, the method 300 further includes a step 312 of disposing molding material 132 on the first surface 118 of the substrate 104, at least one lateral surface 144 of the stiffener element 124, and on at least one lateral die surface 136, wherein the first molding surface of the molding material 132 is substantially flush with the first surface of the die 116. The molding material 132 provides both protection to the die, preventing cracking upon the coupling of a heat sink 148 to the die 116, and reduces local stresses to the substrate 104, such as stresses at the stiffener interface 128 due to the CTE value of the molding material 132, as detailed below. The method 300 may further include a step of coupling a heat sink 148 onto the first die surface 121 and the first molding surface 140, as shown in FIG. 1D.

Figure 3B:
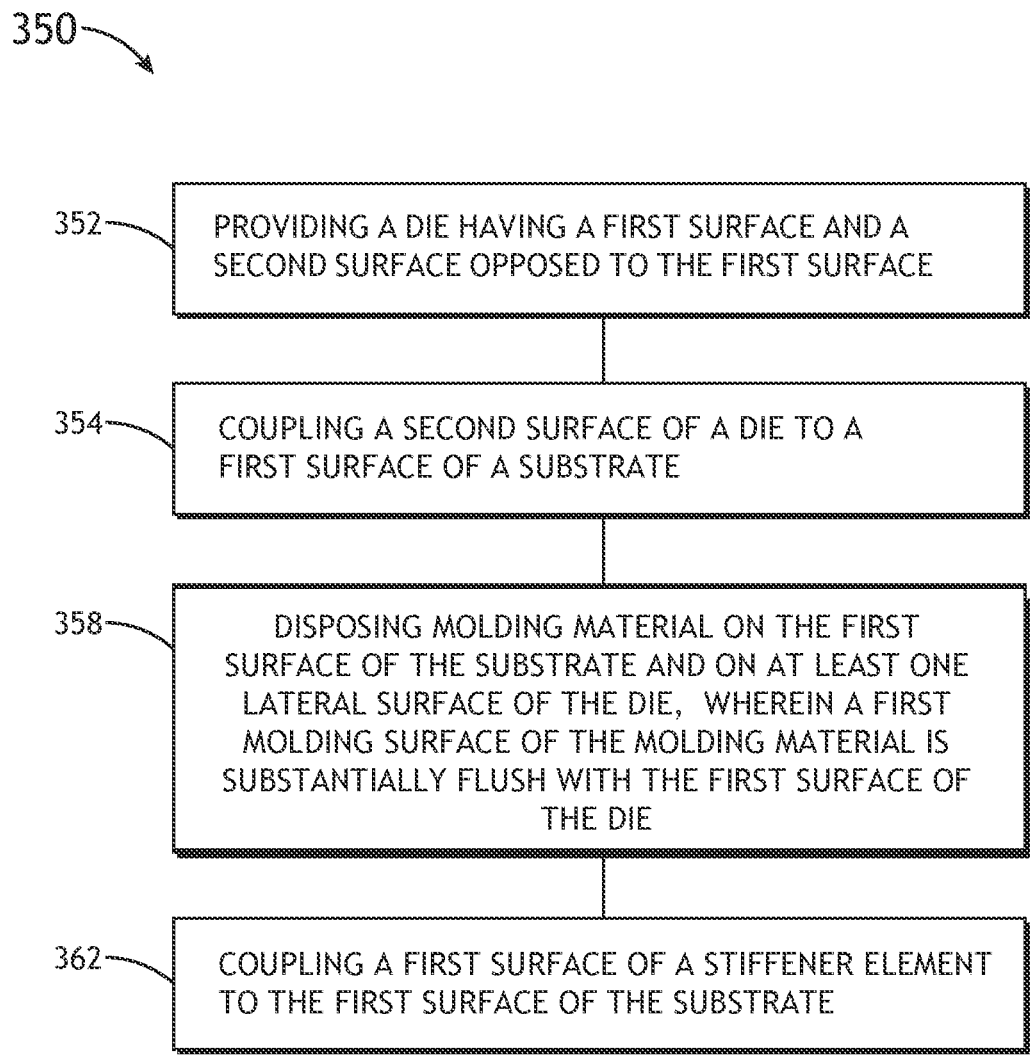

FIG. 3B is a flowchart illustrating a method 350 for building the package 100 with the molding material 132 not contacting the stiffener element 124, in accordance with one or more embodiments of the disclosure. The package 100 produced by this method 350 includes the die-protective aspects of the molding material 132, but does not provide stress reduction at the stiffener interface 128. Similar to method 300, method 350 includes a step 352 of providing a die 116 having a first die surface 121 and a second die surface 122 opposed to the first die surface 121. The method 350 further includes a step 354 of coupling the second die surface 122 to the first surface 118 of the substrate 104. The method 350 further includes a step 358 of disposing molding material on the first surface 118 of the substrate 104 and on at least one lateral surface of the die 116, wherein the first molding surface 140 of the molding material 132 is substantially flush with the first surface of the die 116. The method 350 further includes a step 362 of coupling the first surface 125 of the stiffener element 124 to the first surface 118 of the substrate 104.

Figure 4A:
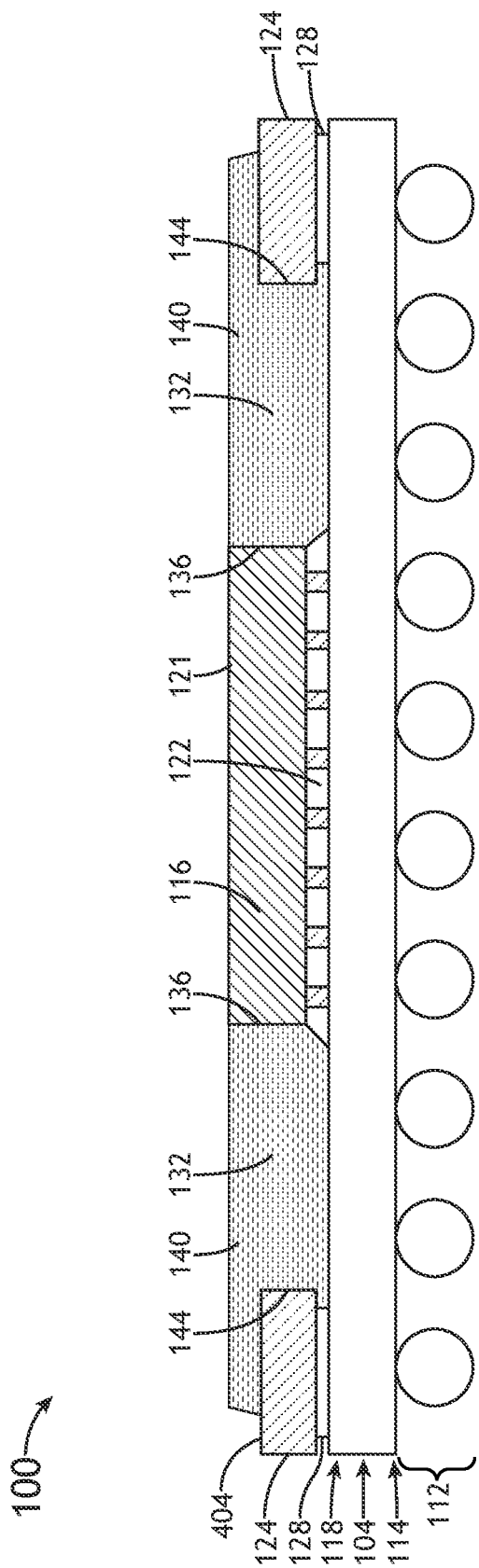
FIGS. 4A-B are drawings illustrating a cut-away side view of the package, in accordance with one or more embodiments of the disclosure.
Figure 4B:
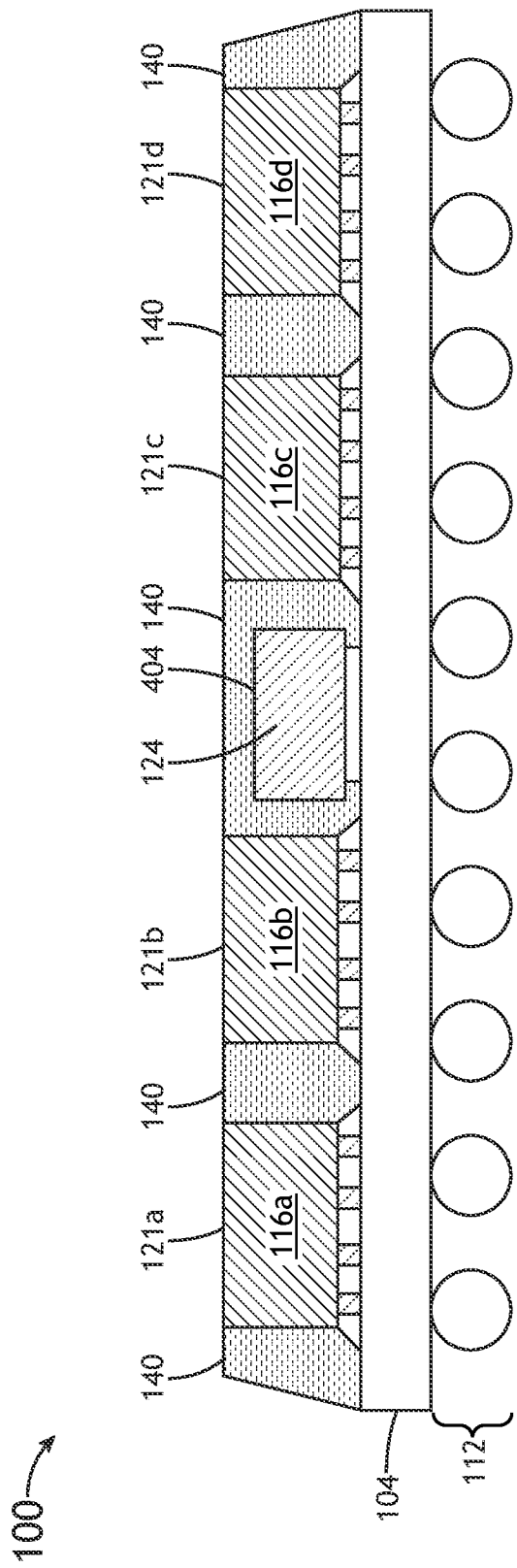

In some embodiments, the stiffener element 124 is partially or fully covered by the molding material 132, as shown in FIGS. 4A-B, in accordance with one or more embodiments of the disclosure. For example, the height of the stiffener element 124 may be lower than the height of the die 116, so when the molding material 132 is disposed on the substrate 104 and the first molding surface 140 is substantially flush, or coplanar, with the first die surface 121. The molding material 132 may also partially or fully cover a top stiffener surface 404 of the stiffener element. For example, as shown in FIG. 4A, which illustrates a cut-away side-view of the package 100 with a stiffener element 124 configured as a ring covering the border/edge of the first surface 118 of the substrate, the molding material 132 covers more than half of the top stiffener surface 404. In another example, in FIG. 4B, illustrating a cut-away side view of a package 100 with a stiffener element 124 configured as a bar along a center of the package 100, the molding material 132 covers the entirety of the top stiffener surface.

Figure 5A:
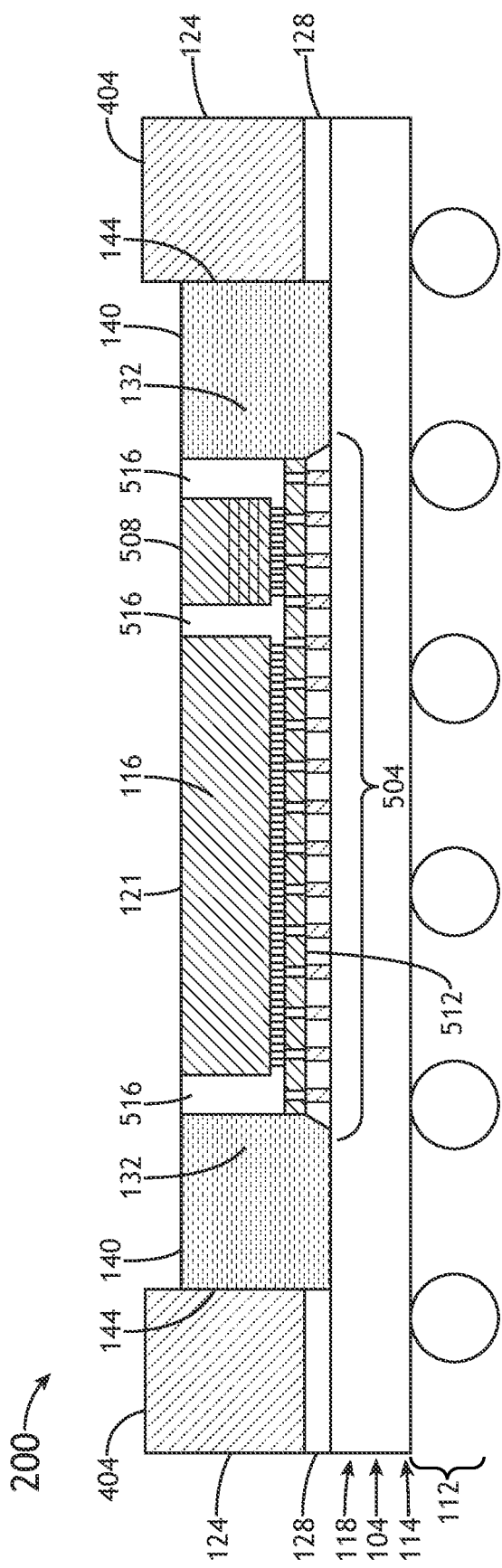
FIGS. 5A-C are drawings illustrating a cut-away side view of a package that includes a Chip-on-Wafer-on-Substrate package, in accordance with one or more embodiments of the disclosure.
Figure 5B:
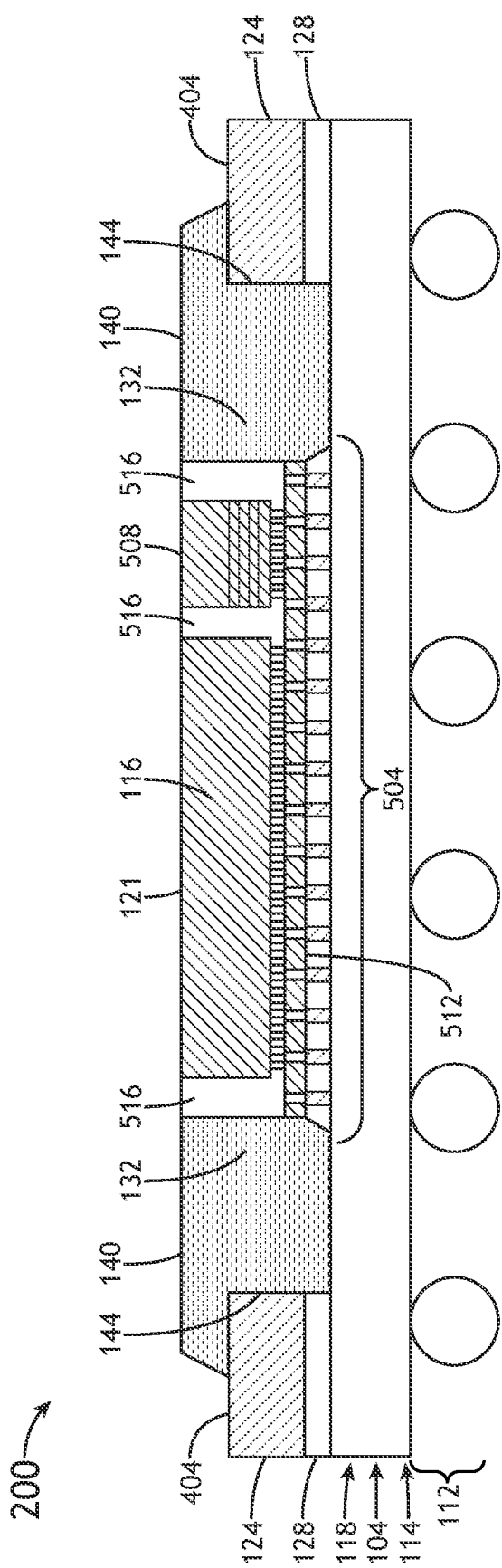
Figure 5C:
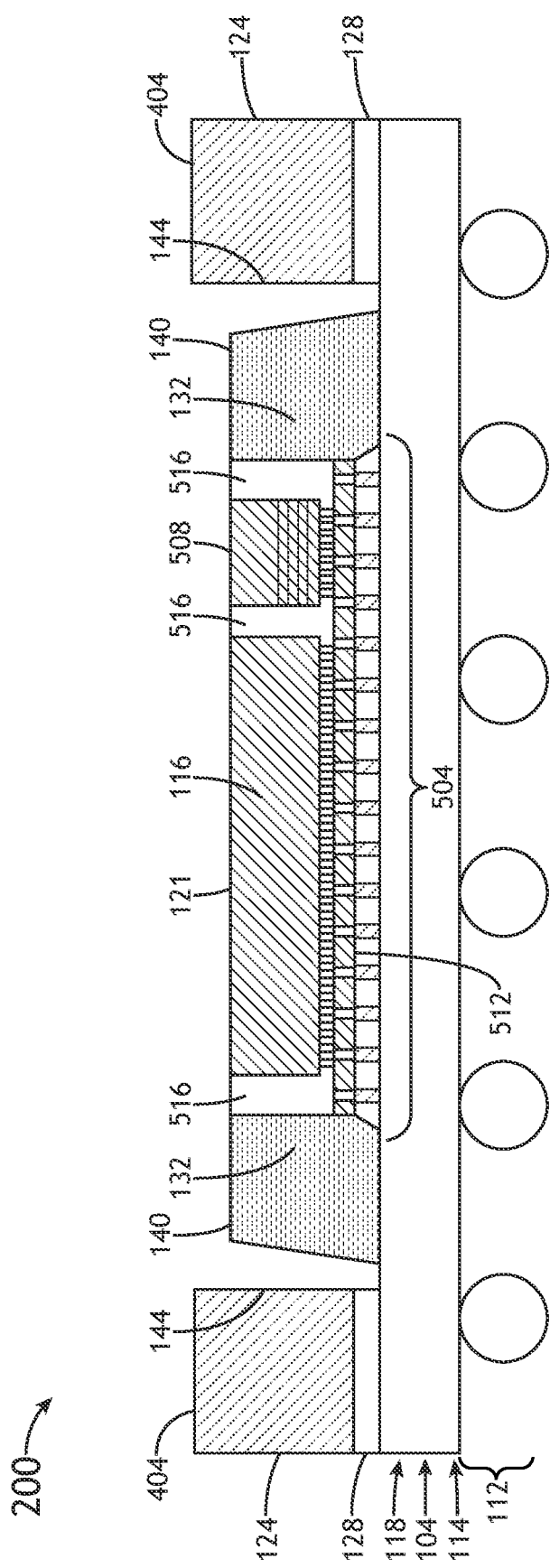

FIGS. 5A-C illustrate a cut-away side view of a CoWoS (chip-on-wafer-on-substrate) package 200 that includes a CoW (chip-on-wafer) 504, in accordance with one or more embodiments of the disclosure. The CoWoS package 200 may include one or more, or all, components of the package 100, and vice versa. For example, the CoW 504 may include an interposer 512 that is coupled to the first surface 118 of the substrate 104, with the die 116, a memory stack 508, or other semiconductor components coupled to the interposer 512. The CoW 504 can be assembled at other manufacturing site before placement onto the substrate 104 to complete the CoWoS package assembly. The components on top of the interposer 512 is often encapsulated with an encapsulation molding compound (EMC) 516 that protects, or stabilized, the components and their interconnections with the interposer 512.

In embodiments, one of the dies 116 of the CoW 504 includes a die 116 having a first die surface 121 that is near-flush or substantially flush to the first surface 140 of the molding material 132. For example, the molding material 132 may be added to the package 100 so that the first surface 140 is substantially flush to the first die surface 121 of the tallest die 116 in the CoW 504 or the CoWoS package 200. The stiffener element 124 may be taller than the first surface 140 of the molding material 132. For example, the top stiffener surface 404 may be taller than the first surface 140 of the molding material 132, and the molding material 132 deposited so that no molding material 132 covers the top stiffener surface, as shown in FIG. 5A. In another example, the stiffener element 124 is shorter than the first die surface 121, and the molding material 132 is deposited so that the molding material 132 partially or fully covers the top stiffener surface 404, as shown in FIG. 5B. In another example, the molding material 132 does not contact the stiffener element 124, as shown in FIG. 5C.

In some embodiments, the die 116 is configured as chiplet module that includes a plurality of chiplets. Chiplets are smaller than traditional dies, with several chiplets fitting within a traditional package 100. The package 100 may include multiple chiplet modules, and may include one or more dies 116 within a larger chiplet module.

Figure 6A:
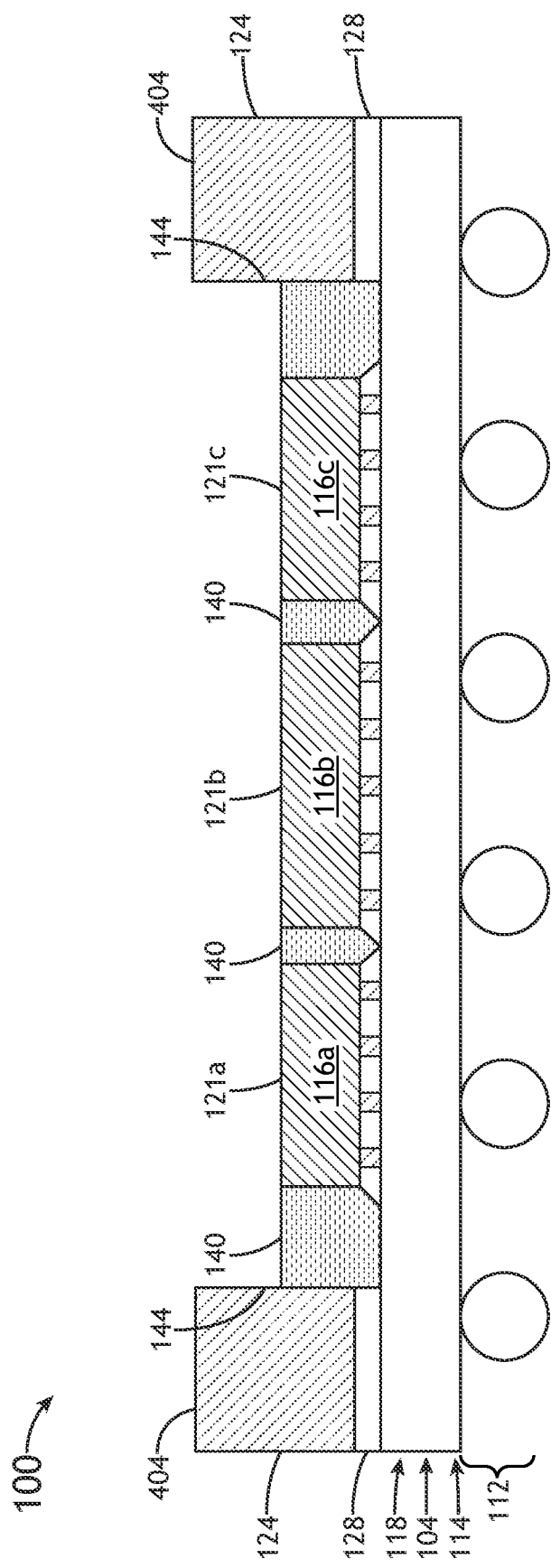
FIGS. 6A-C are drawings illustrating a cut-away side view of the package, in accordance with one or more embodiments of the disclosure.
Figure 6B:
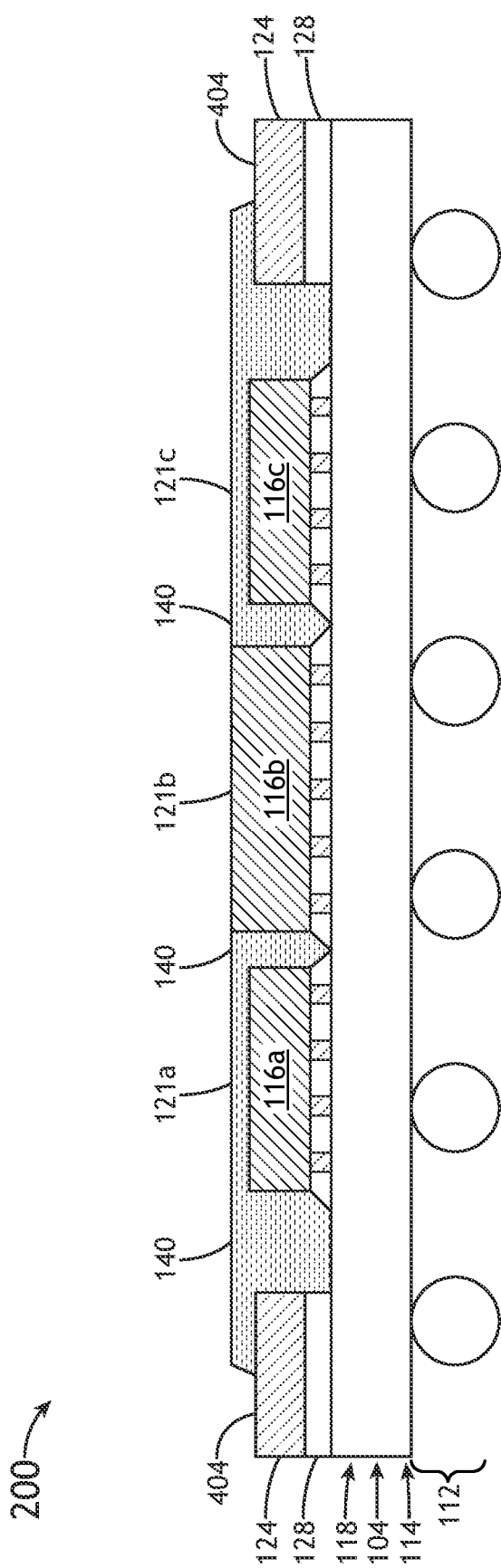
Figure 6C:
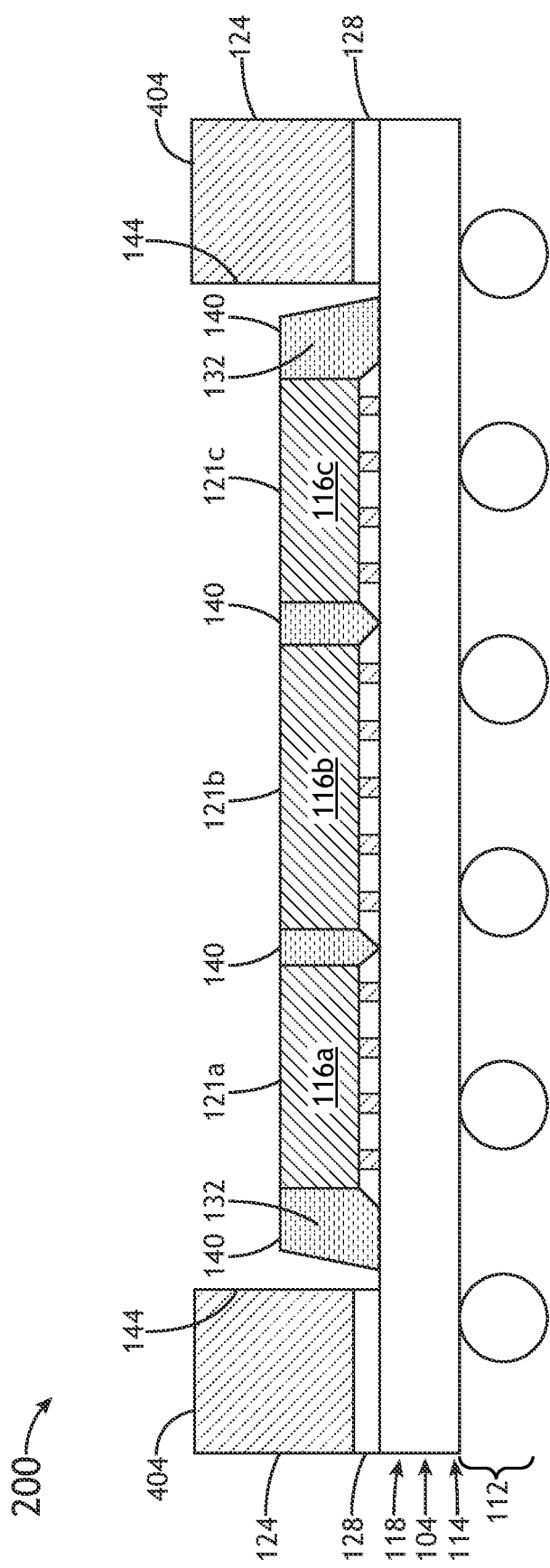

FIGS. 6A-C are drawings illustrating a cut-away side view of the package 100 with a ring-like stiffener element 124 and multiple dies 116a-c, in accordance with one or more embodiments of the disclosure. In embodiments, the dies 116a-c are of similar height, and the molding material 132 is deposited to the package 100 such that the first molding surface 140 is substantially flush, or coplanar" with the first die surfaces 121a-c or two or more, or all dies 116a-c. In cases where there are dies 116 of different heights the molding material 132 may be deposited to the package 100 such that one of the first die surfaces 121 (e.g., the tallest die 116) is substantially flush to the first molding surface 140. For example, in FIG. 6B, the first molding surface 140 is deposited coplanar with the first die surface 121 of the tallest chip 116b. In some cases, the first molding surface 140 is flush with the first die surface of a die 116 that is not the tallest chip or package component disposed on the substrate 104. In another example, the package 100 may include multiple first molding surfaces 140 based on different areas of the package 100. For instance, the package 100 may include multiple molding material surfaces 140 for dies 116 with differing heights.

FIGS. 6A-C also present differing stiffener element 124 and molding material 132 configurations. For example, the molding material 132 may be deposited so that the molding material 132 covers a portion of the lateral surface 144 of the stiffener element 124, as shown in FIG. 6A, or covers a portion or the entirety of the top stiffener surface 404, as shown in FIG. 6B. The molding material 132 does not contact the stiffener element 124 as shown in FIG. 6C.

In embodiments, the molding material 132 is formulated to exhibit a CTE value, $CTE_{mold}$, which is intended to reduce localized stresses at the interface between package components, such as the stiffener attachment adhesive 128, or the interface between the die 116 and the substrate 104. For example, the molding material may be formulated to exhibit a $CTE_{mold}$ value that falls between the values of the $CTE_{stiffener}$ value and the $CTE_{die}$ value (e.g., $CTE_{die} < CTE_{mold} < CTE_{stiffener}$). For example, the molding material 132 may be formulated to exhibit a $CTE_{mold}$ value of approximately 7 ppm/° C., a value that falls between the values of $CTE_{die}$ (e.g., approximately 3 ppm/° C.) and the values of $CTE_{stiffener}$ (e.g., typically 10-16 ppm/° C.). In another example, the package 100 may include molding material 132 having a $CTE_{mold}$ value of approximately 10 ppm/° C., a die 116 having a $CTE_{die}$ value of approximately 3 ppm/° C., and a stiffener having a $CTE_{stiffener}$ value of approximately 15 ppm/° C.

Figure 7A:
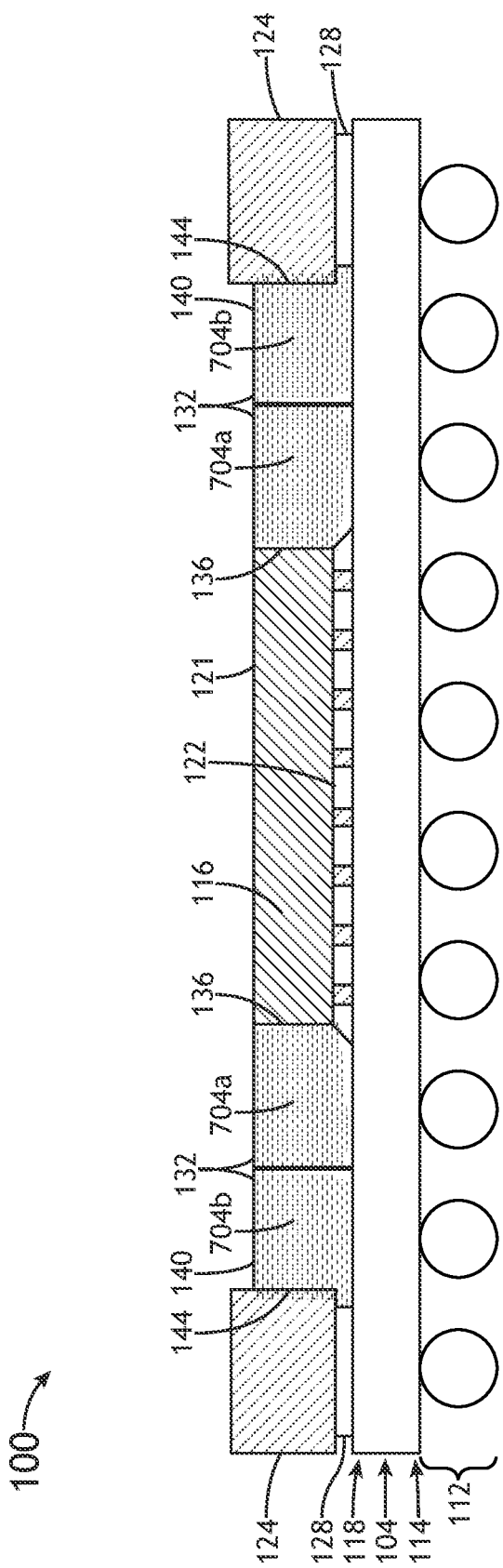
FIGS. 7A-B are drawings illustrating a cut-away side view of the package having differing molding portions, in accordance with one or more embodiments of the disclosure
Figure 7B:
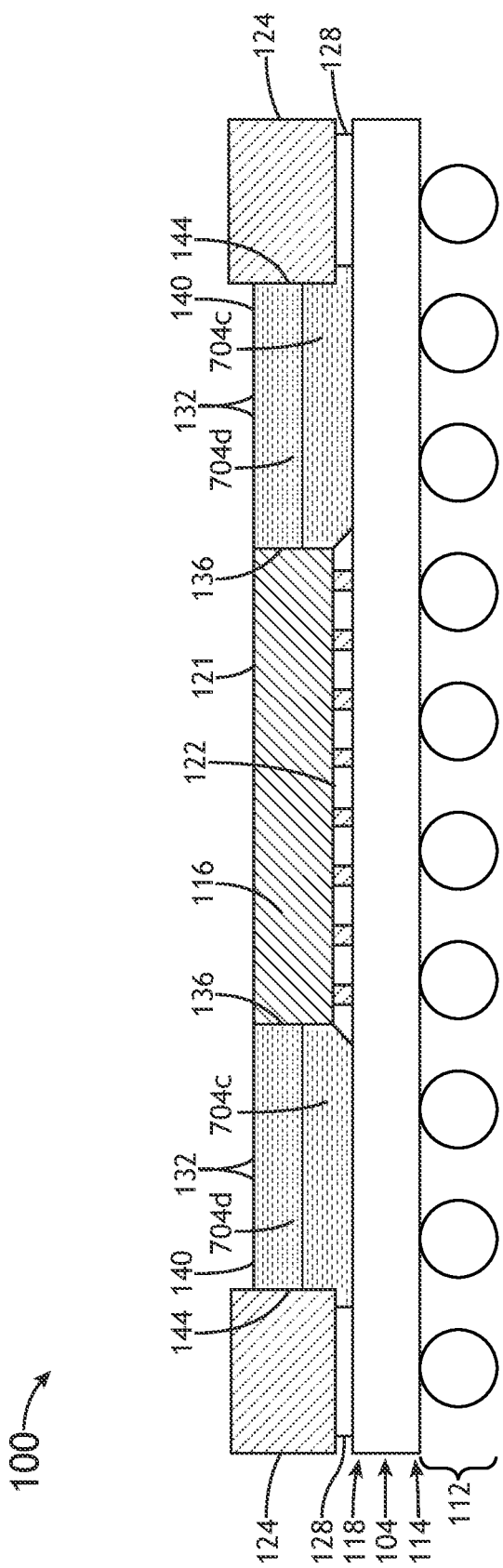

FIGS. 7A-B are drawings illustrating a cut-away side view of the package 100 with a ring-like stiffener element 124 and a die 116, along with molding material 132 divided into molding portions 704a-b, in accordance with one or more embodiments of the disclosure. In embodiments, the molding portions 704a-b (e.g., molding material portions), have differing CTE values. For example, the first molding portion 704a may have a first molding portion CTE value, $CTE_{mold1}$, and the second molding portion 704b may have a second molding portion CTE value, $CTE_{mold2}$. Molding portions 704a-b with differing CTE values may then be applied to the package 100 so that package components with considerably different CTE values (e.g., the die 116 and the stiffener element 124) will have contact with molding portions 704 having similar CTE values. For example, and in reference to FIG. 7A, the package 100 may include a stiffener element 124 having a $CTE_{stiffener}$ value of 15 ppm/° C. in contact with a first molding portion 704a having a $CTE_{mold1}$ value of 10 ppm/° C., and a second molding portion 704b having a $CTE_{mold2}$ value of 7 ppm/° C. that is in contact with a die 116 having a $CTE_{die}$ value of 3 ppm/° C. (e.g., $CTE_{die} < CTE_{mold2} < CTE_{mold1} < CTE_{stiffener}$). The positioning of materials with differing CTE values onto the substrate 104, produces a step-wise gradient of CTE values. This gradient of CTE values reduces localized stresses at the stiffener interface 128, resulting in decreased warpage.

The molding portions 704a-b may be added in any order or sequence. For example, molding portion 704a may be added first to the first surface 118 of the substrate 104 and the lateral die surface 136 of the die 116. The stiffener element 124 may be then coupled to the first surface 118 of the substrate 104. Finally, molding portion 704b may then be added, filling a gap between the stiffener element 124 and molding portion 704a. Other combinations of steps for the addition the molding portions 704a-b to the package 100 are possible.

The molding portions 704 may also be arranged vertically, as shown in FIG. 7B, in accordance with one or more embodiments of the disclosure (e.g., the third molding portion 704c is disposed upon the first surface 118 of the substrate 104, and the fourth molding portion 704d is disposed upon the third molding portion 704c). For example, the package 100 may include a third molding portion 704c with a CTE value, $CTE_{mold3}$ that is relatively close to (e.g., 80%-100%), or greater than, $CTE_{substrate}$, that is first applied, or disposed upon, the first surface 118 of the substrate. The package may also include a fourth molding portion 704d with a CTE value, $CTE_{mold4}$, that is less than $CTE_{mold3}$ (e.g., $CTE_{mold3} < CTE_{mold4}$) that is disposed on top of the third molding portion 704c. For instance, the package 100 may include a substrate 104 having a $CTE_{substrate}$ value of 12 ppm/° C., a third molding portion 704c having a $CTE_{mold3}$ value of 10 ppm/° C., and a fourth molding portion 704d having a $CTE_{mold4}$ value of 7 ppm/° C. The vertically-stacked arrangement of molding portions 704 act to relieve local stresses in the substrate, such as at the stiffener interface 128. The molding portions 704 may be deposited in other of arrangements besides vertical or horizontal layering. For example, the molding portions may be arranged diagonally, or in configurations specific for the application for system 90.

The package may include any number of molding portions 704, each having different CTE values, including, but not limited to, two molding portions 704, three molding portions 704, four molding portions 704, five molding portions 704, or more than five molding portions 704. In some embodiments, the molding material is formulated to exhibit a gradient of CTE values from one end of the first molding surface 140 to another. This gradient of CTE values may result in a molding material 132 having nearly unlimited molding portions 704 with corresponding of CTE values. The CTE value of a molding material 132 that includes multiple molding portions 704 can be determined according to the equation:

$$CTE = \Sigma (m_i/m)(\rho/\rho_i) CTE_i.$$

where m and $\rho$ are the mass and density of the entire molding material 132, respectively and $m_i$ and $\rho_i$ are the mass and density components of the molding portions 704, respectively.

The molding material 132 and the molding portions 704 may be formulated to exhibit any CTE value within any range of CTE values. For example, the molding material 132 and the molding portions 704 may have CTE values within the range of 2 to 20 ppm/° C., 3 to 18 ppm/° C., 4 to 16 ppm/° C., or 5 to 14 ppm/° C. For instance, the molding material may exhibit any CTE value including, but not limited to, approximately 3 ppm/° C., approximately 4 ppm/° C., approximately 5 ppm/° C., approximately 6 ppm/° C., approximately 7 ppm/° C., approximately 8 ppm/° C., approximately 9 ppm/° C., approximately 10 ppm/° C., approximately 11 ppm/° C., approximately 12 ppm/° C., approximately 13 ppm/° C., approximately 14 ppm/° C., approximately 15 ppm/° C., approximately 16 ppm/° C., or approximately 15 ppm/° C.

It is to be understood that the disposition of the molding material 132 upon the substrate 104, the die 116, or the stiffener element 124 may include one or more intervening layers between the molding material 132 and the substrate, the die 116, or the stiffener element 124. For example, the substrate 104, the die 116, and/or the stiffener element 124 may include one or more coatings (e.g., waterproof coatings, laminations, or conformal coatings such as acrylic resin, silicone resin, or urethane resin) that have been applied before the deposition of the molding material 132. Therefore, the above description should be regarded not as a limitation of the present disclosure, but as an illustration.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A system comprising:
a package comprising:
a substrate having a first surface;
a die having a first surface, a second surface and a lateral surface, wherein the first surface and the second surface are opposed to each other, and the second surface of the die is coupled to the first surface of the substrate;
a stiffener element having a first surface, wherein the first surface of the stiffener element is coupled to the first surface of the substrate via a first interface; and
molding material having a first molding surface disposed onto the first surface of the substrate and onto the lateral surface of the die, wherein a coefficient of thermal expansion (CTE) value of the molding material is greater than a CTE value of the die;
wherein the molding material is further disposed onto a lateral side of the stiffener element, the CTE value of the molding material is less than a CTE value of the stiffener element.

2. The system of claim 1, wherein the first molding surface of the molding material is coplanar with the first surface of the die.

3. The system of claim 2, further including a heat sink coupled to the first surface of the die and the first molding surface.

4. The system of claim 1, wherein the stiffener element further comprises a top stiffener surface, wherein the first molding surface covers at least a portion of the top stiffener surface.

5. The system of claim 4, wherein the first molding surface covers an entirety of the top stiffener surface.

6. The system of claim 1, wherein the molding material comprises a plurality of molding portions, wherein the plurality of molding portions comprises a first molding portion having a first molding portion CTE value, and a second molding portion having a second molding portion CTE value, wherein the first molding portion CTE value is greater than the second molding portion CTE value.

7. The system of claim 6, wherein the first molding portion is in contact with the lateral surface of the stiffener element, wherein the second molding portion is in contact with a lateral surface of the die.

8. The system of claim 6, wherein the first molding portion is formed upon the first surface of the substrate, wherein the second molding portion is formed upon the first molding portion.

9. The system of claim 1, wherein the stiffener element is shaped as a ring.

10. The system of claim 1, wherein the stiffener element is shaped as at least one of a cross or a bar.

11. The system of claim 1, wherein the die is configured as a chip-on-wafer-on-substrate (CoWoS).

12. The system of claim 1 wherein the system includes a circuit board operatively coupled to the substrate.

13. The system of claim 1, further comprising a plurality of dies, wherein the molding material, the stiffener element, and the plurality of dies cover greater than 90% of the first surface of the substrate.

14. The system of claim 1, wherein a perimeter of the substrate is not covered by the molding material.

15. The system of claim 1, wherein the substrate has a dimension equal to or greater than 45 mm.

16. The system of claim 1, wherein the substrate has a dimension equal to or greater than 65 mm.

17. A method comprising:
providing a die having a first surface and a second surface opposite to the first surface;
coupling the second surface of the die to a first surface of a substrate;
coupling a first surface of a stiffener element to the first surface of the substrate; and
disposing molding material on:
the first surface of the substrate;
at least one lateral side of the stiffener element; and
at least one lateral surface of the die, wherein a first molding surface of the molding material is coplanar with the first surface of the die.

18. The method of claim 17, further comprising coupling a heat sink to the first surface of the die and the first molding surface.

19. A system comprising:
a package comprising:
a substrate having a first surface and having a dimension equal to or greater than 45 mm;
a die having a first surface, a second surface and a lateral surface, wherein the first surface and the second surface are opposed to each other, and the second surface of the die is coupled to the first surface of the substrate;
a stiffener element having a first surface, wherein the first surface of the stiffener element is coupled to the first surface of the substrate via a first interface; and molding material having a first molding surface disposed onto the first surface of the substrate and onto the lateral surface of the die, wherein a coefficient of thermal expansion (CTE) value of the molding material is greater than a CTE value of the die.

20. The system of claim 19, wherein the molding material comprises a plurality of molding portions, wherein the plurality of molding portions comprises a first molding portion having a first molding portion CTE value, and a second molding portion having a second molding portion CTE value, wherein the first molding portion CTE value is greater than the second molding portion CTE value.

* * * * *